United States Patent
Koops

[11] Patent Number: 6,064,506
[45] Date of Patent: May 16, 2000

[54] OPTICAL MULTI-CHANNEL SEPARATING FILTER WITH ELECTRICALLY ADJUSTABLE PHOTON CRYSTALS

[75] Inventor: Hans Koops, Ober-Ramstadt, Germany

[73] Assignee: Deutsche Telekom AG, Bonn, Germany

[21] Appl. No.: 09/142,405

[22] PCT Filed: Mar. 3, 1997

[86] PCT No.: PCT/EP97/01064

§ 371 Date: Dec. 24, 1998

§ 102(e) Date: Dec. 24, 1998

[87] PCT Pub. No.: WO97/33192

PCT Pub. Date: Sep. 12, 1997

[30] Foreign Application Priority Data

Mar. 5, 1996 [DE] Germany .................. 196 10 656

[51] Int. Cl.[7] .............................. G02B 26/00
[52] U.S. Cl. .............. 359/237; 359/247; 359/298; 359/320; 359/566; 385/40; 385/42; 349/41; 349/49
[58] Field of Search .................. 359/237, 238, 359/239, 247, 298, 320, 566, 558, 559, 318, 245; 385/39, 40, 41, 42, 44, 45, 46; 349/41, 47, 49

[56] References Cited

U.S. PATENT DOCUMENTS

| | | | |
|---|---|---|---|
| 3,622,792 | 11/1971 | Piccininni | 359/298 |
| 5,260,719 | 11/1993 | Maloney | 359/320 |
| 5,299,054 | 3/1994 | Geiger | 359/320 |
| 5,373,393 | 12/1994 | DeJule et al. | 359/320 |
| 5,432,624 | 7/1995 | Black | 359/247 |
| 5,909,303 | 6/1999 | Trezza et al. | 359/247 |

OTHER PUBLICATIONS

Appl. Phys. Letter 67(15), Oct. 9, 1995, pp. 2138–2140—Brown et al.
SPIE vol. 2693—High–Q Photonic Bandgap Resonant Cavities, pp. 170–175—Lin et al, Jan. 1996.
SPIE vol. 2849—Photonic crystals built by 3–D additive lithography . . . pp. 248–256—Koops, Aug. 1996.

*Primary Examiner*—Loha Ben
*Attorney, Agent, or Firm*—Kenyon & Kenyon

[57] ABSTRACT

An optical multipath switch with electrically switchable photonic crystals.

The invention involves the construction of optical multipath switches based on electrically switchable photonic crystals.

A filled photonic crystal, switchable electrically and/or by light, is used as a tunable mirror. By creating selective optical deformations in the photonic crystal, its properties can be influenced in selected areas in terms of transmission capability. This is done preferably by application of a strong electrical field. Light is coupled in and out via fixed photonic mirrors located at an angle to the photonic crystal.

The optical switches of the invention find application in switching networks and serve the purpose of service selection. A very high packing density may be achieved.

7 Claims, 5 Drawing Sheets

OPTICAL MULTI-CHANNEL SEPARATING FILTER WITH ELECTRICALLY ADJUSTABLE PHOTON CRYSTALS

FIELD OF THE INVENTION

The present invention relates to an optical multipath switch composed of electrically switchable photonic crystals.

RELATED TECHNOLOGY

Photonic crystals with band gaps are two-dimensional and three-dimensional dielectric structures in which the propagation of electromagnetic waves, in dependence upon, or independent of, their direction of propagation, is forbidden. See 1) John, Phys. Rev. Lett. 58, 2486 (1987).
2) Yablonovitch, Phys. Rev. Lett. 58, 2058 (1987).
3) L. McCall, P. w: Platzmann, R. Dalichacuch, D. Smith, S. Schulz, Phys. Rev. Lett. 67, 2017 (1991).
4) M. Leung, Y. F. Liu, Phys. Rev. Lett. 65, 2646 (1990).
5) L. McCall, A. F. J. Levi, R. E. Slusher, S. J. Pearton, R. A. Logan, Appl. Phys. Lett. 60, 289 (1992).
6) Yablonovitch, T. M. Gmitter, Phys. Rev. Lett. 63, 1950 (1989).
7) Yablonovitch, T. M. Gmitter, K. M. Leung, Phys. Rev. Lett. 67, 2295 (1991).
8) K. M. Ho, C. T. Chan, C. M. Soukoulis, Phys. Rev. Lett. 65, 3152 (1990).

Calculations and microwave measurements have shown that cubic face-centred or also two-dimensional cubic arrangements of holes in a dielectric matrix, or of dielectric rods, exhibit such photonic band gaps.
See 9) S. Y. Lin, A. Arjavalingam, "Photonic Bound States in Twodimensional Photonic Crystals Probed by Coherent Microwave Transient Spectroscopy", J. Opt. Soc. Am. B/Vol. 11, No. 10 (1994), 2124.
10) S. Y. Lin, G. Arjavalingham, "Tunneling of Electromagnetic Waves in Twodimensional Photanic Crystals", optics Letters, Vol. 18, No. 19 (1993), 666.
11) D. R. Smith, S. Schulz, S. L. McCall, P. M. Platzmann, "Defect Studies in a Two-dimensional Periodic Photonic Lattice", Journal of Modern Optics, Vol. 41, 2 (1994), 395.
12) C. C. Cheng, A. Scherer, "Fabrication of Photonic Bandgap Crystals", J. Vac. Sci. Technol (1995), Nov./Dec., to be published.

As few as six planes suffice to ensure a high element quality. Two-dimensional and three-dimensional structures of this sort are often termed "photonic crystals." These structures can be generated with high precision by means of nanolithography using electron beam induced deposition. If the cavities of such photonic crystals are filled with nonlinear optical materials or liquid crystals and the entire structure is exposed to a strong electrical field, the optically active lattice constant in a crystal can be set within certain limits by variation of the optical path and hence the filtering effect of the element varied electrically. A fabrication method which employs the extended silylation process with dry etching, indiffusion and subsequent element filling, allows the production of highly integrated components at low cost.

Tunable filters used in optical communications and telecommunications are implemented at present in the form of long optical fibres whose filtering effect is created by means of Bragg gratings inscribed in special fibres by ultraviolet light.

13) R. Kashyap, "Photosensitive Optical Fibers: Devices and Applications", Opt. Fibres Techn. 1, pp. 17–34 (1994).
14) C. Cremer, H. Heise, R. Marz, M. Schienle, G. SchulteRoth, H. Unzeitig, "Bragg Gratings on InGaAsP/InPwaveguides as Polarization Independent optical filters", J. of Lightwave Techn., 7, 11, 164 (1989).
15) R. C. Alferness, L. L. Buhll, U. Koren, 2.j. Miller, M. G. Young, T. L. Koch, C. A. Burrus, G. Raybon, "Broadly Tunable InGaAsP/InP Buried Rib Waveguide Vertical Coupler Filter", Appl. Phys. Lett. 60, 8, 980 (1992).
16) C. Wu, C. Rolland, F. Sheperd, C. Laroque, N. Puetz, K. D. Chik, J. M. Xu, "InGaAsp/InP Vertical Coupler Filter with Optimally Designed Wavelength Tunability", IEEE Photonics Technol. 4, 4, 457 (1993).
17) Z-M. Chuang, L. A., Coldren, "Enhanced Wavelength Tuning in Grating Assisted Codirectional Coupler Filter", IEEE Photonics Technology Lett., 5, 10, 1219 (1993).

Fabricating such diffraction gratings with high precision over appreciable lengths of several mm to cm is a great technological challenge. Special procedures aim to correct stitching errors which are commonly experienced in electron beam lithography.

18) H. W. P. Koops, J. Kretz, M. Weber, "Combined Lithographies for the Reduction of Stitching Errors in Lithography", Proc. EIPB 94, J. Vac. Sci. Technol. 3 12 (6) (1994), pp. 3265–3269.
19) B. H. Koek, T. Chisholm, A. J. van Run, J. Romijn, "Sub 20 nm Stitching and Overlay for Nanolithography Applications", Jpn. J. Appl. Phys., Vol. 33 (1994), x.-.x.
20) V. V. Wong, J. R. Ferrera, N. J. Damask, H. I. Smith, "Fabrication and Measurement of Highly Coherent Electronbeam-written Bragg Resonators", Abstracts EIPB '95, Scottsdale N3, 331 (1995).

Incorporation of fiber filters and fiber couplers into a macroscopic optical arrangement needs be accomplished using connectors or splices and a hybrid technology. A miniaturization of components is not achievable in this manner. The process called additive lithography uses computer-controlled electron beam induced deposition to build miniaturized photonic crystals, designed as two-dimensional and three-dimensional arrangements of long miniaturized needles, from dielectric materials with nanometer precision.

21) H. W. P. Koops, R. Weiel, D. P. Kern, T. H. Baum, "High Resolution Electron Beam Induced Deposition", Proc. 31st Int. Symp. on Electron, Ion, and Photon Beams, J. Vac. Sci. Technol. B (1) (1988), 477.

These crystals can be inserted direct in the optical path. High-precision computer control of the electron beam in location, time and direction of motion enables the generation of nearly all required crystal geometries and their selective deformation needed to serve the intended optical purpose. Thereby the optical behaviour of their structure can be tailored to meet the desired needs. By filling the highly refractive needle structures with nonlinear optical material—see 22) M. Eich, H. Looser, D. Y. Ycon, R. Twieg, G. C. Björklund, "Second Harmonic Generation in Poled Organic Monomeric Glasses", J. Opt. Soc. Am. B, 6, 8 (1989).
23) M. Eich, A. Sen, H. Looser, D. Y. Yoon, "Corona Poling and Real Time Second Harmonic Generation Study of a Novel Covalently Functionalized Amorphous Nonlinear Polymer", J. Appl. Phys. 66, 6 (1989).
24) M. Eich, G. C. Björklund, D. Y. Yoon, "Poled Amorphous Polymers of Second Order Nonlinear Optics", Polymers for Advanced Technologies, 1, 89 (1990)—or by filling the highly refractive needle structures with liquid crystals—see 25) R. Birenheide, M. Eich, D. A. Jungbauer, 0. HermannSchönherr, K. Stoll, J. H. Wendorff, "Analysis of Reorientational Processes in Liquid Crystalline Side Chain Polymers Using Dielectric Relaxation, Electrooptical Relaxation and Switching Studies", Mol. Cryst. Liq. Cryst., 177, 13 (1989)—and by applying a strong electrical field to the filled structure, the optical path in the crystal and hence its properties can be set electrically. This allows the optical transmission characteristic to be shifted finely, and the optical mirror effect, the direction of reflection and possibly the intensity to be varied. Since such elements possess both a very high quality and a very small size (their dimensions are only a few μm in length, width and height), optical devices and circuits equipped with such filters and mirrors can be implemented with a high packing density.

In addition, solutions exist which use multibeam writing systems with corpuscular beams. These solutions permit optoelectronic devices and integrated optical circuitry to be fabricated most economically by means of additive lithography. See 26) H. Koops, 1974, German Patent Application P 2446 789.8-33, "Korpuskularstrahloptisches-Gerät zur Korpuskelbestrahlung eines Präparates", U.S. Pat. No. 4,021, 674, granted on May 4, 1977.

27) H. Koops, 1974, German Patent Application 2 2460 716.7, "Korpuskularstrahloptisches Gerät zur Korpuskelbestrahlung eines Präparates", German patent granted on Dec. 30, 1976.

28) H. Koops, 1974, German Patent Application P 2460 715.6, "Korpuskularstrahloptisches Gerät zur Korpuskelbestrahlung eines Pädparates in Form eines Flächenmusters mit mehreren untereinander gleichen Flächenelementen", German patent granted on Oct. 31, 1979.

29) H. Koops, 1975, German Patent Application P 2515 550.4, "Korpuskularstrahloptisches Gerät zur Abbildung einer Maske auf ein zu bestrahlendes Präparat", German patent granted on May 18, 1977.

30) M. Rüb, H. W. P. Kcops, T. Tschudi, "Electron Beam Induced Deposition in a Reducing Image Projector", Microelectronic Engineering 9 (1989), pp. 251–254.

31) H. Elsner, H.-J. Döring, H. Schacke, G. Dahm, H. W. P. Koops, "Advanced Multiple Beam-shaping Diaphragm for Efficient Exposure", Microelectronic Engineering 23 (1994), pp. 85–88.

SUMMARY OF THE INVENTION

It is an object of the present invention to provide a low-loss switch arrangement based on electrically tunable photonic crystals and hence providing a high packing density.

According to the present invention, a two-dimensional or three-dimensional photonic crystal is made from highly refractive dielectric material using of electron beam induced deposition. Photonic crystals with band gaps and one or more narrowband transmission frequency ranges, depending on their design, act as narrowband filters. Calculations and microwave measurements have shown that cubic facecentered or also two-dimensional cubic arrangements of holes in a dielectric matrix, or of dielectric rods, exhibit such band gaps. As few as six planes suffice to ensure a high element quality.

The process called additive lithography is employed to build two- and three-dimensional arrangements of long miniaturized needles from dielectric materials with nanometer precision, direct in the optical path. Owing to high-precision computer control of the electron beam in location, time and direction of motion, process allows the generation of nearly all demanded geometries of crystals and their selective deformation needed to serve the intended optical purpose. This makes it possible to tailor the optical behaviour of the crystal structure to meet the desired needs. Similar structures can also be created by means of nano-lithographic procedures and the extended silylation process using dry etching.

By filling the cavities between the needles with nonlinear optical materials and placing the crystal in the electrical field, the arrangement can be electrically tuned within a certain wavelength range and adjusted with high precision. Liquid crystal materials, which serve to fill the structure, permit tunability of the filter over a broad frequency range. By use of liquid crystals as fillers, the filter is operable as a medium-velocity switch. In this fashion, a switchable mirror can be constructed from a crystal filled with nonlinear material.

A switch of the present invention is composed of tunable photonic crystals. These crystals consist of long miniaturized needles which act as high-precision optical mirrors. Such needles serve to generate an optical geometry in which deformations acting as photonic band gaps are created selectively. The cavities between the needles are filled up with nonlinear optical materials or liquid crystals. By appropriate placement of electrodes in the optical geometry, i.e., application of a strong electrical field, the optical transmission characteristic of the entire geometry can be changed up to reflection. Arranging further divided electrodes for separate control of the electrical fields in individual crystal areas of the optical geometry ensures that the optical geometry is at the same time separately variable in individual crystal areas up to reflection. Fixed photonic mirrors are placed directly in the optical path at angles to the individual directions so that the light can be coupled in and out through these mirrors. In this way, an optical switch function is performed by variation of the transmission characteristic of the optical geometry in combination with the selective coupling out of light via the individual fixed photonic mirrors.

BRIEF DESCRIPTION OF THE DRAWINGS

Embodiments of the present invention are elucidated below with reference to the drawings, in which.

DETAILED DESCRIPTION

Figure 1:
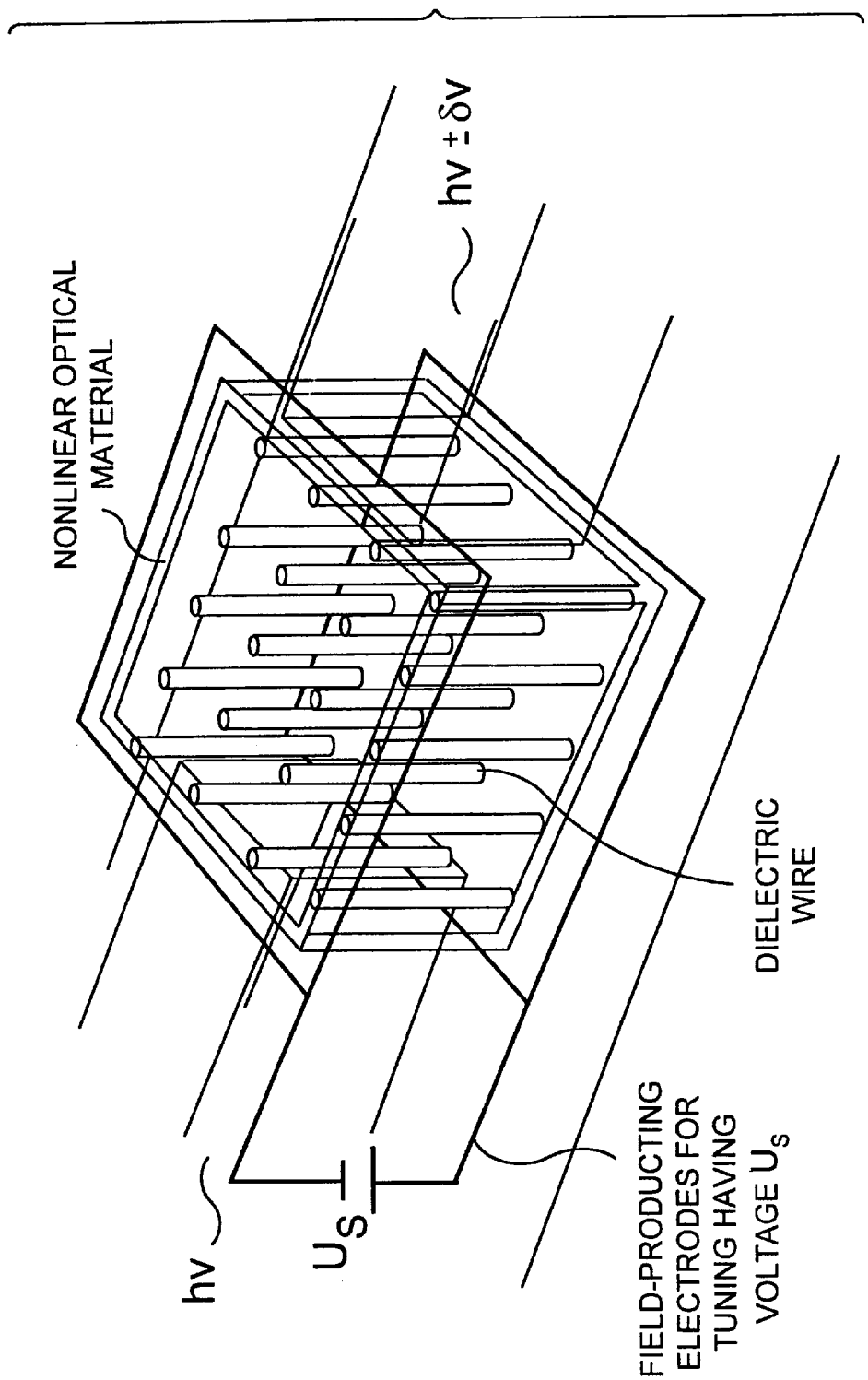
FIG. 1 shows a schematic diagram of a tunable photonic crystal which is used as a narrowband filter in a monomode waveguide.

FIG. 1 shows a schematic diagram of a tunable photonic crystal which is used as a narrowband filter in a monomode waveguide.

Figure 2:
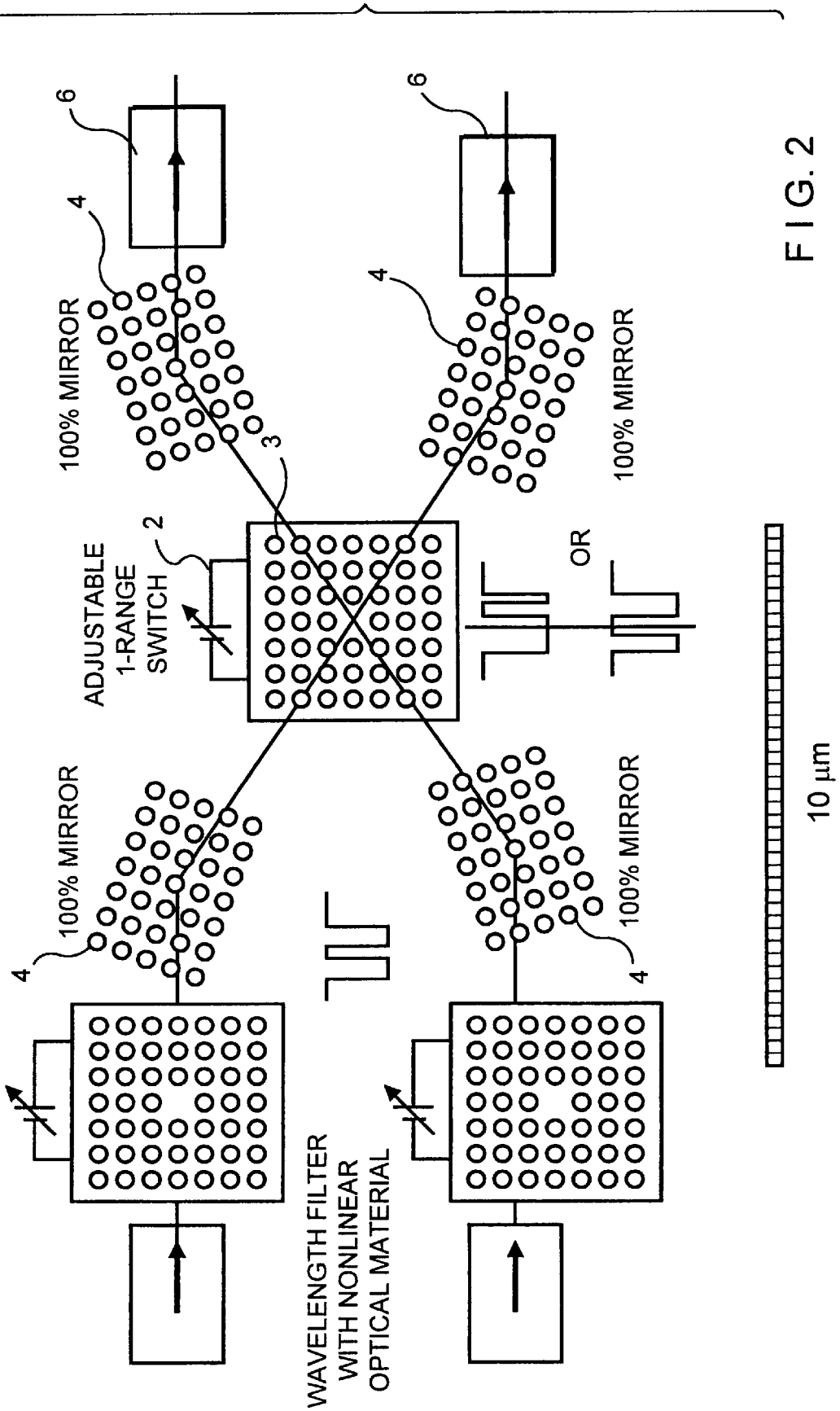
FIG. 2 shows a schematic diagram of a two-path optically adjustable low-loss switch.

Based on this principle, an optically adjustable low-loss, two-path switch can be designed, for example, as illustrated in FIG. 2. To achieve this, a photonic crystal 2 having a critical geometry acting as a tunable mirror is placed in the optical path between fixed photonic mirrors 4. These mirrors are orientated such that the light is mirrored at an angle of 22.5 degrees and hence hits the geometry of the photonic crystal, which is filled with nonlinear material 3 and acts as a tunable mirror, at a 45 degree angle. If the geometry of the photonic crystal acting as a tunable mirror is switched to transmission direction, the light can pass unrestrictedly. When the geometry of the photonic crystal acting as a tunable mirror is switched to reflection the light is reflected exactly at the fixed mirror, which couples the light into the connecting waveguide 6.

Components of this kind find application in switching networks and serve service selection purposes. The packing density used in this technology is strongly increased because the arrangement composed of mirrors and filter switches is less than 12 μm long and wide.

Figure 3:
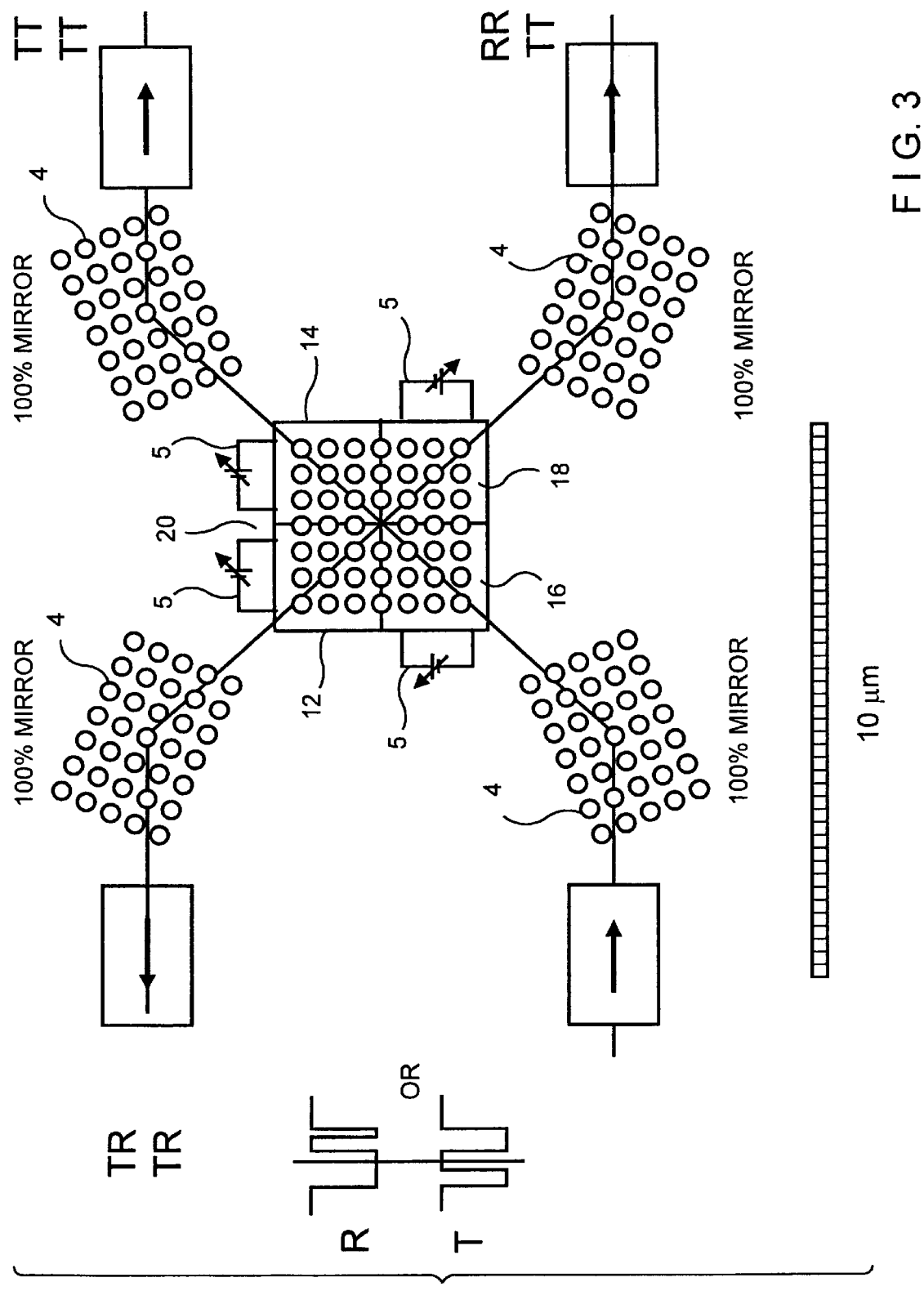
FIG. 3 shows a schematic diagram of a three-path optically adjustable low-loss switch.

If the field plates 5 in the crystal area are structured into four parts, a transmission and reflection can be set in either half by alternate switching of the four crystal quadrants 12, 14, 16, and 18 respectively. In this manner a three-path switch 20 according to FIG. 3 may be realized, the switch having an element with beam paths orientated at 90 degree angles to one other.

By selective switching of transmission and reflection in crystal areas between finer structured field plates, the beam intensity can also be split up under electronic control.

Another possibility for influencing the electrical setting of the switch is to couple additional light into the photonic crystal by means of a controllable light source directed at the crystal filled with nonlinear optical material. This allows fast switching in the upper gigahertz range. In the process, the light can also be directed at the waveguide light guidance plane from the space above or below it. This renders guidance of the switching and the switched light possible in separate planes.

Figure 4:
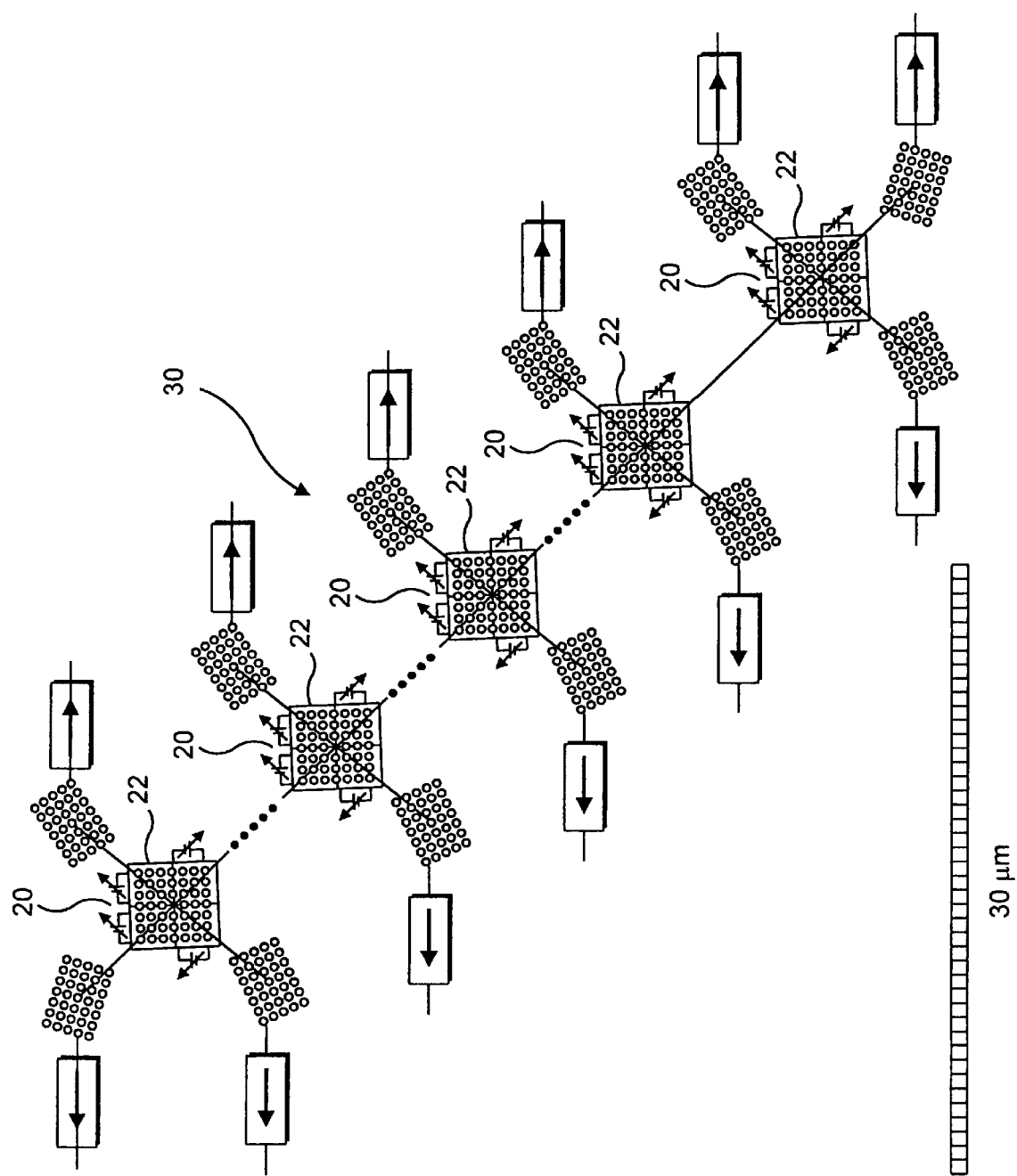
FIG. 4 shows a schematic diagram of an electrically controllable multipath switch composed of a plurality of three-path switches.

FIG. 4 represents schematically an electrically controllable multipath switch 30 which has several three-path switches 20 formed of photonic crystal areas 22 that are separately tunable electrically and deflection mirrors built from photonic crystals. This arrangement therefore constitutes a cascaded coupler switch which consists of miniaturized switchable four-path directional couplers made from photonic crystals with an adjustable bandpass filter.

Figure 5:
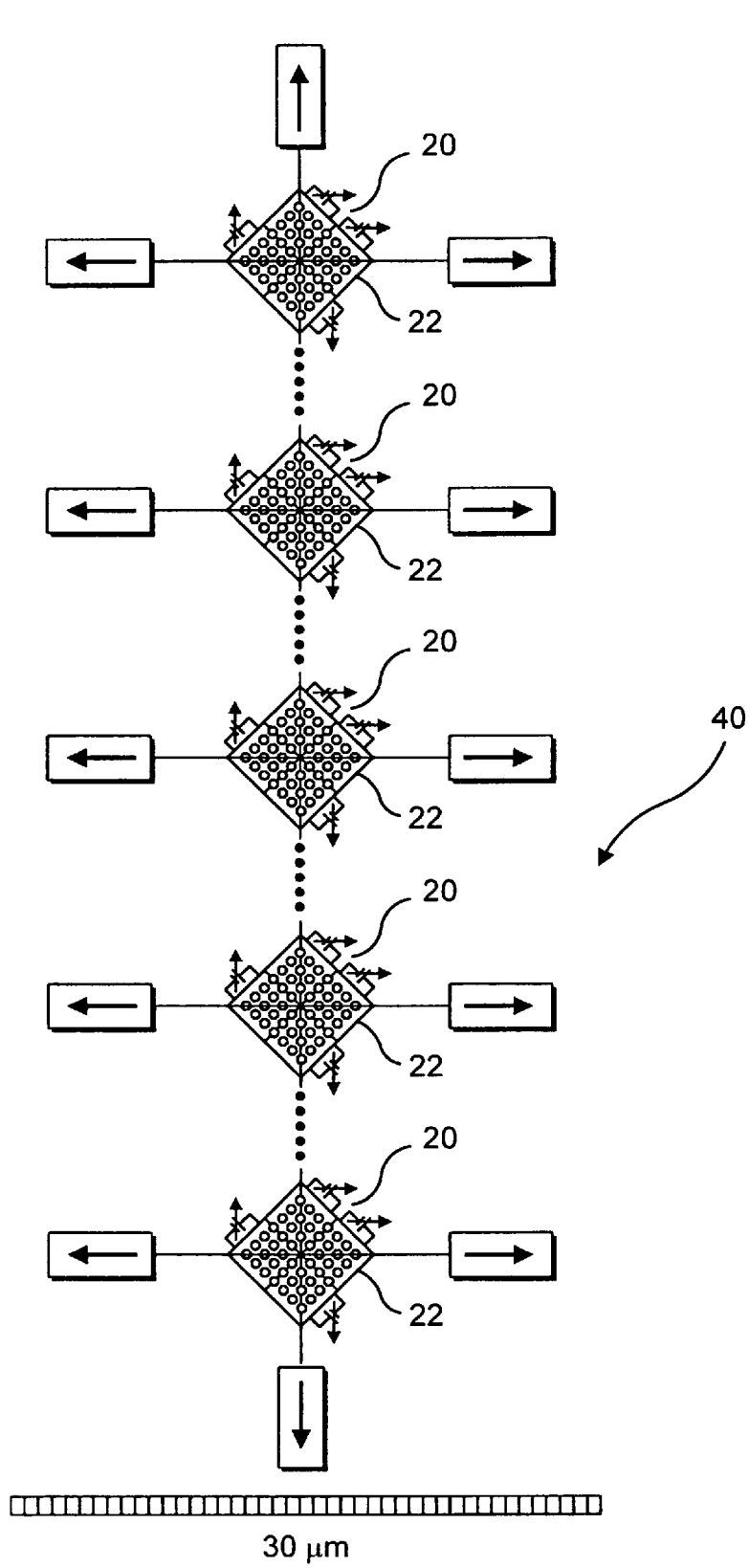
FIG. 5 shows a schematic diagram of an electrically switchable multipath switch.

FIG. 5 shows the schematic diagram of an electrically switchable multipath switch. The latter encompasses several three-path switches 20 formed of photonic crystal areas 22 which are separately tunable electrically and thus constitute a cascaded coupler switch which consists of miniaturized switchable fourpath directional couplers with an adjustable bandpass filter.

These devices can be combined with similar or different integrated components—for example, mirrors, phase shifters and reflectors--to build integrated circuits for optical signal processing and optical computers with high packing density. It is also possible to fabricate fixed or variable measurement circuits serving to fulfill security functions and to conduct data communication tests on optical fibers.

The present invention represents a novel electrically controllable array of switches designed in integrated technology and with high packing density. The present invention serves to switch voltages and/or light between, or to cross-connect, at least two optical paths. Through the use of high-integration technology, little or no space is required for insertion of the element into the optical paths of, say, a computer circuit.

What is claimed is:

1. An optical multipath switch having electrically switchable photonic crystals, the switch comprising an optical geometry structure including tunable photonic crystals having long miniaturized needles and acting as high-precision optical mirrors, deformations acting as photonic band gaps capable of being generated selectively in the structure;

cavities between the needles being filled with nonlinear optical materials or liquid crystals enabling an optical transmission characteristic of the optical geometry structure to be varied up to reflection by disposing first electrodes in the structure and applying a strong electrical field;

the optical geometry structure being provided with second, divided electrodes for providing separate field guidance in crystal areas for enabling the optical transmission characteristic of the structure to be varied separately in individual crystal areas up to reflection;

the optical geometry structure being disposed between mirrors of fixed photonic crystals having an orientation so that light hits the optical geometry at a predetermined angle and the light is capable of being coupled in and selectively out via the mirrors.

2. An optical multipath switch as recited in claim 1 wherein the optical geometry structure is a tunable mirror switchable between transmission and reflection states, the structure being disposed in an optical path between the mirrors of fixed photonic crystals, the mirrors of fixed photonic crystals being orientated so that the light is mirrored at a 22.5 degree angle and hits the structure at a 45 degree angle, the structure permitting the light to pass unrestrictedly when switched to a transmission state, and, when switched to a reflection state, the structure reflecting the light in the mirrors of fixed photonic crystals, the mirrors of fixed photonic crystals coupling the light into a connecting waveguide, forming a two-path switch with beam crossconnect capability.

3. An optical multipath switch as recited in claim 1 wherein the optical geometry structure is disposed between the second, divided electrodes, the second electrodes being divided into four quadrants each having an electrical field separately adjustable so that individual subcrystals are switchable to transmission and reflection states, enabling the photonic crystals to permit the light to pass unrestrictedly or to reflect in one of two directions, so that a function of an electrically switchable three-path switch is performed.

4. An optical multipath switch as recited in claim 1 wherein the tunable photonic crystals are divided into a plurality of crystal areas capable of being used either to direct light from a direction to connecting directions or to an adjacent one of the other plurality of crystal areas so that a branchoff to other directions is formed, the optical multipath switch being capable of forming a cascadable switching structure of decadic or other modular arrangement.

5. An optical multipath switch as recited in claim 1 wherein the tunable photonic crystals direct light at the mirrors of fixed photonic crystals for orienting the light at 45 degree angles according to a rectangular pattern so that the tunable photonic crystals are geometrically matched.

6. An optical multipath switch as recited in claim 1 wherein the tunable photonic crystals are divided by selectively arranged deformations into more than four areas, enabling a fine separation of the areas and a matching of an intensity of deflected light rays and of different directions.

7. An optical multipath switch as recited in claim 1 wherein the switch is set electrically by a controllable light source directed at the tunable photonic crystals, enabling additional light to be coupled into the crystals.

* * * * *